United States Patent [19]

Nishimura et al.

[11] Patent Number: 5,094,714
[45] Date of Patent: Mar. 10, 1992

[54] WAFER STRUCTURE FOR FORMING A SEMICONDUCTOR SINGLE CRYSTAL FILM

[75] Inventors: Tadashi Nishimura; Kazuyuki Sugahara; Shigeru Kusunoki; Yasuo Inoue, all of Itami, Japan

[73] Assignee: Mitsubishi Denki Kabushiki Kaisha, Japan

[21] Appl. No.: 607,800

[22] Filed: Oct. 31, 1990

Related U.S. Application Data

[63] Continuation of Ser. No. 302,031, Jan. 26, 1989, abandoned, which is a continuation of Ser. No. 907,487, Sep. 15, 1986, abandoned.

[30] Foreign Application Priority Data

Sep. 17, 1985 [JP] Japan .................. 60-205667

[51] Int. Cl.$^5$ .................................................. C30B 1/08
[52] U.S. Cl. .................. 156/616.4; 156/603; 156/DIG. 64; 428/428; 428/411.1
[58] Field of Search .............. 156/610, 603, DIG. 99, 156/DIG. 88, DIG. 93, 616.4; 427/93; 437/979, 67, 90; 148/DIG. 50, DIG. 81, DIG. 134, DIG. 168; 428/428, 411.1

[56] References Cited

U.S. PATENT DOCUMENTS

| | | | |
|---|---|---|---|
| 3,969,168 | 7/1976 | Kuhn | 427/93 |
| 4,178,396 | 12/1979 | Okano et al. | 427/93 |
| 4,371,421 | 2/1983 | Fan et al. | 156/DIG. 88 |
| 4,444,620 | 4/1984 | Kovacs et al. | 156/603 |
| 4,544,576 | 10/1985 | Chu et al. | 437/67 |
| 4,565,584 | 1/1986 | Tamura et al. | 156/603 |
| 4,565,599 | 1/1986 | Geis et al. | 156/603 |
| 4,585,512 | 4/1986 | Hayafuji et al. | 156/617 R |
| 4,678,538 | 7/1987 | Haond et al. | 156/603 |
| 4,773,964 | 9/1988 | Haond | 156/603 |

FOREIGN PATENT DOCUMENTS

| | | | |
|---|---|---|---|
| 58-40822 | 3/1983 | Japan | 437/90 |
| 59-61118 | 4/1984 | Japan | 437/90 |

OTHER PUBLICATIONS

Kawamura et al., "Laser Recrystallization of Si over SiO$_2$ with a Heat-Sink Structure", J. Appl. Phys. 55(6) 1984, pp. 1607–1609.

Bean et al., "Dielectric Isolation: Comprehensive, Current, and Future", J. Electrochem. Soc., vol. 124, No. 1, pp. 5C–12C.

Geis et al., Journal of Electrochem. Soc., vol. 130, No. 5, pp. 1178–1183.

Primary Examiner—R. Bruce Breneman
Attorney, Agent, or Firm—Lowe, Price, LeBlanc & Becker

[57] ABSTRACT

A wafer structure for forming a semiconductor single crystal film comprises a semiconductor single crystal substrate, a plurality of recesses formed in a grooved shape to one main surface of the semiconductor single crystal substrate, insulation material embedded to the inside of these recesses, an insulation layer deposited over the insulation material and the semiconductor single crystal substrate and integrated with the insulation material and a polycrystalline or amorphous semiconductor layer to be recrystallized disposed over the insulation layer.

A wafer structure with no or less grain boundaries can be obtained. Further, polycrystalline or amorphous semiconductor layer can be prevented from peeling off the substrate by the additional layering of a protecting insulation layer.

14 Claims, 3 Drawing Sheets

20: Silicon substrate
21: Grooved portion
22, 24: Silicon dioxide layer
23: Polycrystalline silicon layer

FIG. 1
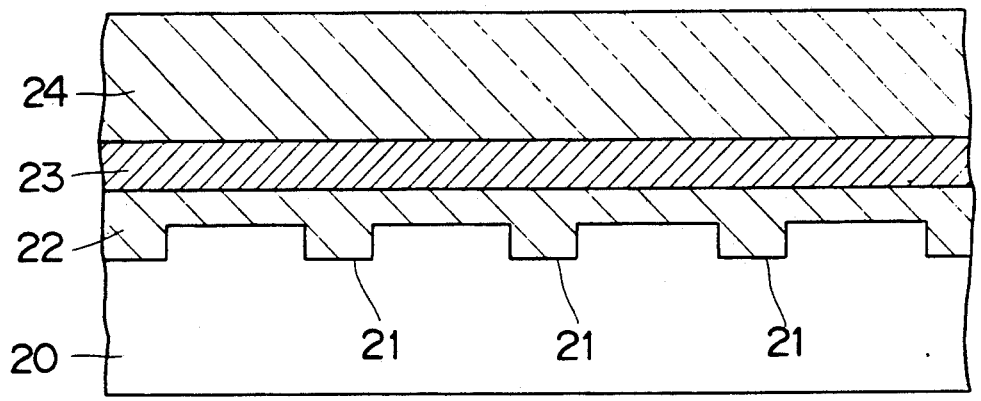
20: Silicon substrate
21: Grooved portion
22, 24: Silicon dioxide layer
23: Polycrystalline silicon layer
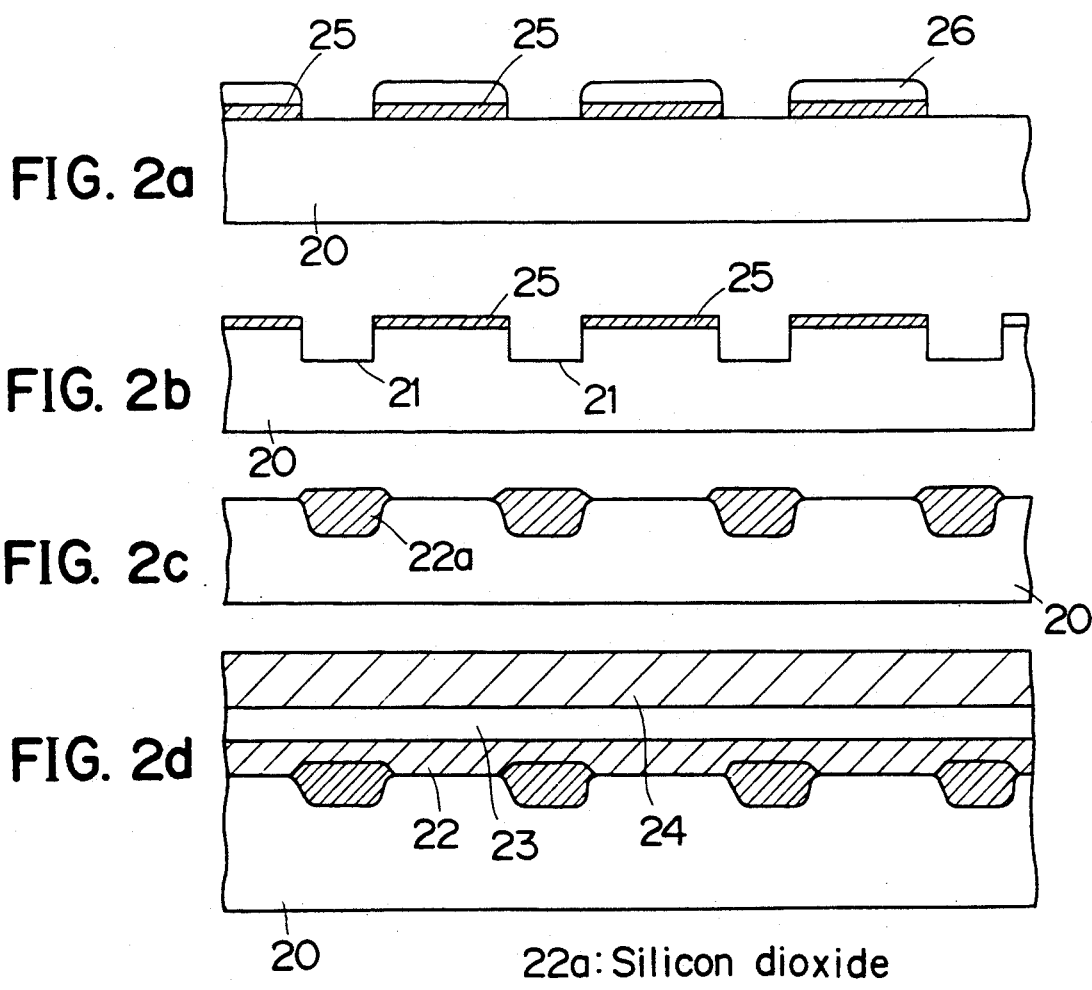
22a: Silicon dioxide

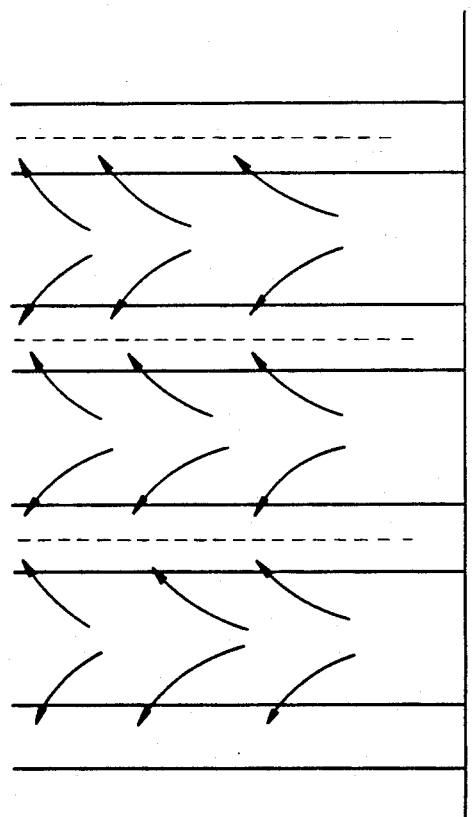
FIG. 3a
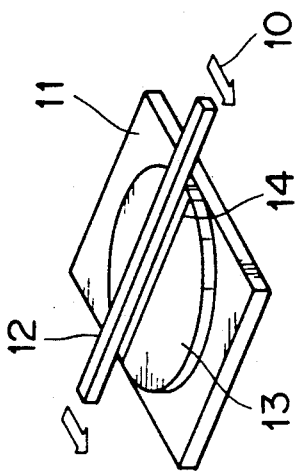
FIG. 4
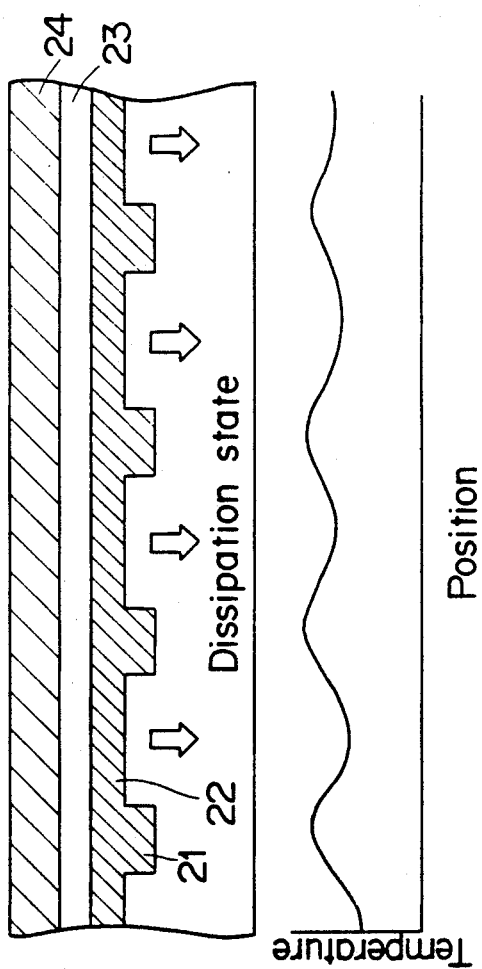
FIG. 3b
FIG. 3c
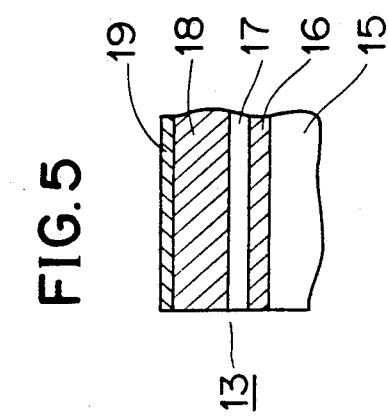
FIG. 5

40: Polycrystalline silicon layer
42: Silicon nitride layer
41: Silicon dioxide layer 5,094,714

WAFER STRUCTURE FOR FORMING A SEMICONDUCTOR SINGLE CRYSTAL FILM

This application is a continuation of application Ser. No. 302,031, filed Jan. 26, 1989, now abandoned, which is a continuation of 907,487, filed Sept. 15, 1986, now abandoned.

BACKGROUND OF THE INVENTION

This invention concerns a wafer structure for forming a semiconductor single crystal film in which a single crystal film of a semiconductor is formed on an insulation layer.

Operation speed and density of semiconductor integrated circuits have been increased in recent years susbtantially to their limit obtainable by conventional interdevice separation technics. In view of the above, an attention has now been attracted to SOI (Silicon On Insulator) structures or SOI technics that can improve the reliability upon operation by completely separating the insulation layer as far as the bottom face of a device in addition to the separation only for the lateral direction, as well as can attain an increased speed due to the reduction in the parasitic capacitance.

FIG. 4 of the appended drawings is a perspective view showing a typical device for use in a zone melting method capable of collectively obtaining single crystal films on a large area wafer in a short time, in which are shown a lower heater 11, a linear heater 12, a specimen wafer 13 and a melting zone 14 in the specimen wafer 13.

Referring to the melting method, the specimen wafer 13 is heated at about 1200° C. by the lower heater 11, as well as a local temperature increased region is formed by the linear heater 12 from above to form a stripe-like melting zone 14 on the surface of the specimen wafer 13 and a polycrystalline semiconductor layer deposited on the specimen wafer 13 is converted into single crystals by moving the linear heater 12 in the direction of the arrow 10.

FIG. 5 shows the structure of the specimen wafer employed so far in the zone melting method described above. The specimen wafer 13 comprises a thick silicon dioxide layer 16 of about 0.5 μm formed on one main surface of a single crystal silicon substrate 15 and a polycrystalline silicon layer 17 to be melted and recrystallized is formed to a thickness of about 0.5 μm on the surface of the silicon dioxide layer. Further, a silicon dioxide layer 18 of about 2 μm and a silicon nitride layer 19 of about 30 μm are formed in lamination as the protection layer on the surface of the polycrystalline silicon layer 17 for preventing the layer 17 from peeling off the silicon substrate 15 upon melting.

Since the conventional wafer structure for forming the semiconductor single crystal film has been constituted as described above, the polycrystalline silicon layer 17 to be used as the semiconductor device after the recrystallization is sandwiched between relatively thick insulation layers, in which no satisfactory heat dissipation can be obtained. Particularly, since the region of the polycrystalline silicon layer 17 heated to an extremely high temperature upon melting and recrystallization has a width as large as about 2 mm relative to its thickness of about 500 Å, it is extremely difficult for dissipating latent heat upon solidification and for controlling the temperature distribution and the setting temperature required for preventing boiling in the melting zone 14. Although the melting zone 14 may be considered linear in macro point of view, the solid-liquid interface is never linear when examined finely. This is caused due to the difference of the growing speed on every directions of the crystal face and, accordingly, the face (111) having the lowest growing speed constitutes the solid-liquid interface as shown in FIGS. 6a and 6b (the silicon dioxide layer 18 and the silicon nitride layer 19 are not illustrated in FIGS. 6a and 6b). Accordingly, the growing direction is not aligned with but somewhat inclined to the scanning direction of the heating source. Thus, distortions are induced in the illustrated regions 30 where the growing faces meet with each other and, finally, small-angled grain boundaries are generated to loss the conditions for the growth of the single crystals. The sites in which such small-angled grain boundries are generated can not be controlled at all by the conventional wafer structure and, accordingly, this causes degradation for the uniform characteristics of the device formed to the crystalline layer.

SUMMARY OF THE INVENTION

This invention has been accomplished in order to solve the foregoing problems and the object of the invention is to obtain a wafer structure for forming a semiconductor single crystal film capable of obtaining a single crystal film on the entire surface of the wafer of a shape having 4 or greater inch diameter or a shape comparable therewith stably within a range of the controlling performance for the conventional temperature distribution and setting temperature.

Another object of this invention is to obtain a wafer structure for forming a semiconductor single crystal film capable of preventing the polycrystalline or a crystalline semiconductor layer to be recrystallized from peeling off the semiconductor single crystal substrate.

A further object of this invention is to obtain a wafer structure for forming a semiconductor single crystal film capable of effectively and uniformly heating a polycrystalline or amorphous semiconductor layer to be recrystallized.

In one aspect of a wafer structure for forming a semiconductor single crystal film according to this invention, at least two grooved recesses are disposed periodically to the surface of a semiconductor single crystal substrate, insulation materials are embedded into the recesses, an insulation layer is further formed over the entire surface of the substrate and a polycrystalline or amorphous semiconductor layer to be recrystallized is disposed at the surface of the insulation layer.

In another aspect of the wafer structure for forming the semiconductor single crystal film according to this invention, a protecting insulation layer is further formed on the polycrystalline or amorphous semiconductor layer to be recrystallized.

In a further aspect of the wafer structure for forming the semiconductor single crystal film according to this invention, a protecting insulation layer and a polycrystalline semiconductor layer are further formed on the polycrstalline or amorphous semiconductor layer to be recrystallized.

Since the recesses grooved to the surface of the semiconductor single crystal substrate are embedded with insulation materials and insulation layers are formed on the upper portion thereof and over the entire surface of the substrate in the wafer structure for forming the semiconductor single crystal film according to this invention, the thickness of the insulation layer is periodically different and the heat dissipation state to the substrate is periodically controlled upon melting and recrystallization at the surface. Accordingly, the grain growth occurring along with the movement of the heat source is always resulted from thin to thick insulation layers and the sites where the grain growing faces from both sides meet to each other. If the direction, of the grain growing faces on both sides are different, the grain boundaries are formed there, whereas single crystals are formed in the entire region if directions of the faces are identical. Further, since the distribution for the thickness of the insulation material is resulted due to the recesses on the side of the semiconductor single crystal substrate, recrystallized silicon layer is formed on the flat insulation layer and the device can be manufactured with no restrictions at all.

Further, in another feature of the wafer structure for forming the semiconductor single crystal film according to this invention, the polycrystalline or amorphous semiconductor layer to be recrystallized can be prevented from peeling off the semiconductor single crystal substrate due to the presence of the protecting insulator layer.

In a further aspect of a wafer structure for forming the semiconductor single crystal film according to this invention, the protecting insulation layer and the polycrystalline semiconductor layer can render the heating of the polycrystalline or amorphous semiconductor layer to be recrystallized more uniform and effective.

BRIEF DESCRIPTION OF THE DRAWINGS

These and other objects, as well as features of this invention will become apparent by reading the following descriptions in conjunction with the accompanying drawings, wherein FIG. 1 is a cross sectional view illustrating a wafer structure for forming a semiconductor single crystal film in one embodiment according to this invention;

FIGS. 2a through 2d are cross sectional views illustrating the successive steps for the method of forming the wafer structure as shown in FIG. 1, FIGS. 3a through 3c are, respectively, plan views of a cross sectional view and a block diagram showing the principle for obtaining single crystals, FIG. 4 is a perspective view for illustrating the zone melting and recrystallizing device using heaters, FIG. 5 is a cross sectional view illustrating the conventional wafer structure.

FIGS. 8A and 8B are, respectively, a fragmentary plan view of the wafer of this invention with the polycrystalline silicon layer and second silicon dioxide layer removed, and a cross-sectional view showing the seed opening in the wafer of this invention.

DESCRIPTION OF THE PREFERRED EMBODIMENTS

Figure 6A:
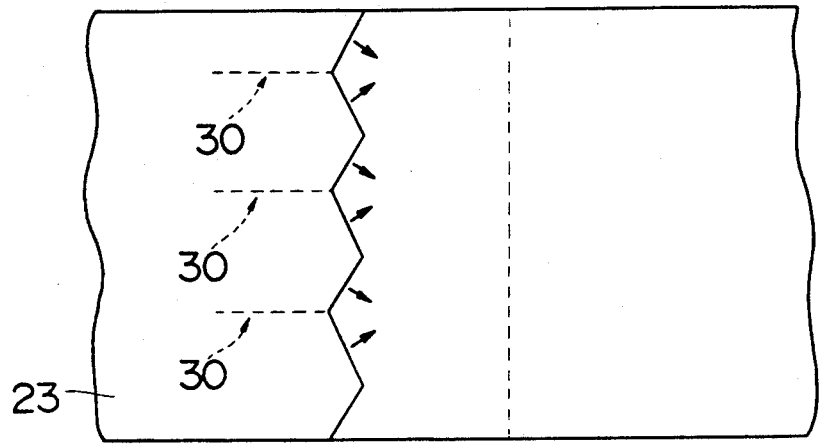
FIGS. 6a and 6b are, respectively, a plan view and a cross sectional view illustrating the state of the recrystallized layer in the conventional wafer structure
Figure 6B:
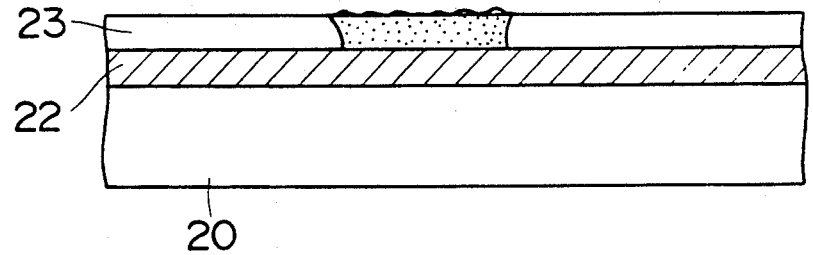

Preferred embodiments of this invention will now be described by way of examples referring to FIGS. 1 to 3.

EXAMPLE

This invention will now be explained by way of its preferred embodiments referring to the drawings. In FIG. 1, there are shown a silicon substrate 20, a plurality of grooves 21 with a depth of about 0.5 to 1 $\mu$m recesses in the silicon substrate 20, a silicon dioxide layer 22 with a thickness of about 0.5 to 2 $\mu$m, a polycrystalline silicon layer 23 to be recrystallized with a thickness of about 0.4 to 1.0 $\mu$m and a silicon dioxide layer 24 with a thickness of about 2 $\mu$m.

Explanation will then be made to the method of forming a wafer structure for forming a semiconductor single crystal film in this embodiment. In FIG. 2a, a silicon nitride layer 25 disposed on the silicon substrate 20 is applied with etching by photoprint-making technics with 70 $\mu$m width and at 30 $\mu$m pitch by using resist 26 as a mask. Then, the silicon substrate 20 is etched as it is by means of reactive etching to be formed with grooves 21 to a depth of about 0.5 $\mu$m as shown in FIG. 2b. Then, the resist 26 is removed and the grooves portions 21 are filled with silicon dioxide 22a thermal oxidation at 950° C. using the silicon nitride layer 25 as a mask. Then, the silicon nitride layer 25 is removed and silicon dioxide layer 22 is formed over the silicon dioxide 22a and the silicon substrate 20 by using a CVD process under a reduced pressure, by which the surface is made flat although the silicon dioxide layer 22 has a varying depth. In this step, a portion of the silicon dioxide layer 22 is opened to form opening 30, as shown in FIGS. 8A and 8B, to expose the silicon substrate 20. Then, the polycrystalline silicon layer 23 is deposited to a thickness of 5000 Å and the silicon dioxide layer 22 is deposited to about 2 $\mu$m by using the CVD process respectively as shown in FIG. 2d.

The wafer having such a structure is heated to 1200°-1300° C. from the side of the silicon wafer 20 and a narrow melting zone is resulted to the polycrystalline silicon layer 23 by heating from the surface using a linear heater as shown in FIG. 4 and the zone is moved to recrystallize by scanning the heater in parallel with the grooved portions 21 in the silicon substrate 20 at a rate 0.1-0.5 mm/sec. In this case, since the thickness of the silicon dioxide layer 22 beneath the polycrystalline silicon layer 23 to be melted and recrystallized varies periodically, heat hardly escapes at the thicker portion of the layer and easily escapes at the thinner portion to lower the temperature of this portion. Accordingly, the grain growth always proceeds from the lower to higher temperature portions, that is, from the thinner to thicker portions of the silicon dioxide layer 22 as determined by the substrate structure. Then, the grain boundary are left on the thicker region of the silicon dioxide layer 22 as a result of the grain growth from both sides. Further, upon starting the grain growth, if the silicon dioxide layer 22 has an opening portion 30 and the axis of crystal in the recrystallized layer is aligned with that of the silicon substrate 20, no grain boundaries are formed since the grain growth on both sides is on an identical crystal phase.

Figure 7:
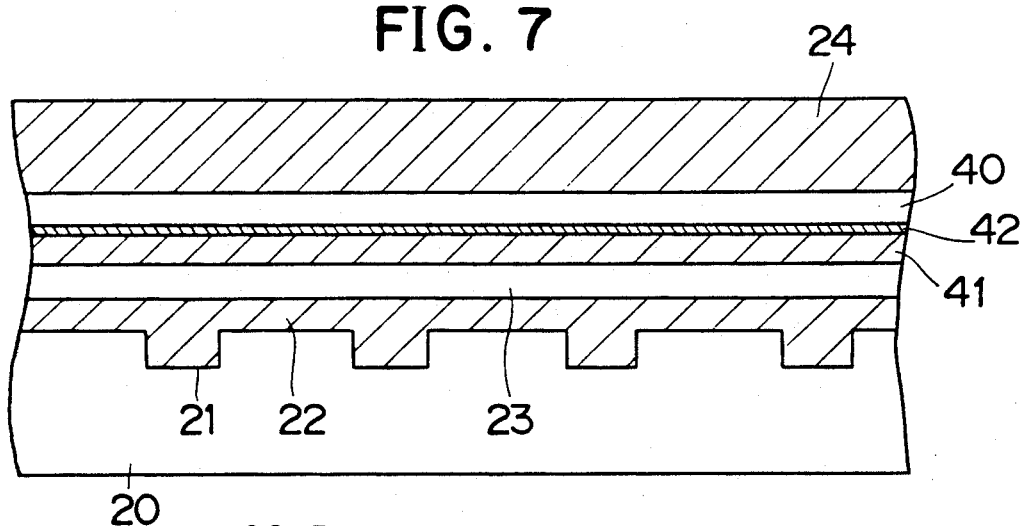
FIG. 7 is a cross sectional view illustrating the wafer structure for forming the semiconductor single crystal film in another embodiment according to this invention.

The wafer structure shown in the above-described example is a fundamental structure and it is technically difficult to maintain the linear molten zone width over the length of the wafer diameter irradiated under the light of a lamp or heater, or high output laser or electron beams. Accordingly, the wafer structure such as shown in FIG. 7 having such an additional structure as moderating the difficulty in addition to the fundamental structure of the invention provides the same effect. That is, in the wafer structure for forming the semiconductor single crystal film in this embodiment, there are laminated, on the upper surface of the polycrystalline silicon layer 23, a silicon dioxide layer 41, a silicon nitride layer 42 and a polycrystalline silicon layer 40 successively, and further a silicon dioxide layer 24.

As having been described above, since it is adapted in one aspect of this invention such that the polycrystalline or amorphous semiconductor layer to be recrystallized is deposited on a semiconductor single crystal substrate formed with a plurality of recesses, recrystallization of the polycrystalline or amorphous semiconductor layer to be recrystallized proceeds in a predetermined direction to obtain a wafer structure for forming the semiconductor single crystal film with less or no grain boundaries.

Furthermore, according to another aspect of this invention, since it is adapted such that a protecting insulation layer is further layered on the polycrystalline or amorphous semiconductor layer to be recrystallized, it is possible to provide a wafer structure for forming the semiconductor single crystal film causing no separation of the polycrystalline or amorphous semiconductor layer to be recrystallized from the substrate of the semiconductor single crystals.

In a further aspect of this invention, since it is constituted such that the protecting insulation layer and the polycrystalline semiconductor layer are deposited on the polycrystalline or amorphous semiconductor layer to be recrystallized, it is possible to obtain a wafer structure for forming the semiconductor single crystal film that can render the surface heating upon recrystallization of the polycrystalline or amorphous semiconductor layer to be recrystallized more effective and uniform.

What is claimed is:

1. A wafer structure for forming a semiconductor single crystal film comprising:
   a semiconductor single crystal substrate,
   a plurality of mutually spaced grooves formed in a main surface of said semiconductor single crystal substrate,
   a first layer of silicon dioxide insulation material filling said grooves,
   a second layer of silicon dioxide insulation material deposited over said first layer of silicon dioxide insulation material and said semiconductor single crystal substrate surface and integral with said first layer of silicon dioxide insulation material in said grooves, said first and second silicon dioxide insulation layers forming a silicon dioxide substrate insulation layer having a flat upper surface, and
   a polycrystalline or amorphous semiconductor layer to be recrystallized disposed over the flat upper surface of said silicon dioxide substrate insulation layer, said polycrystalline or amorphous semiconductor layer having a flat upper surface.

2. A wafer structure for forming a semiconductor single crystal film comprising:
   a semiconductor single crystal substrate,
   a plurality of mutually spaced grooves formed in a main surface of said semiconductor single crystal substrate,
   a first layer of silicon dioxide insulation material filling said grooves,
   a second layer of silicon dioxide insulation material deposited over said first layer of silicon dioxide insulation material and said semiconductor single crystal substrate surface and integral with said first silicon dioxide layer of insulation material in said grooves, said first and second silicon dioxide insulation layers forming a silicon dioxide substrate insulation layer having a flat upper surface,
   a polycrystalline or amorphous semiconductor layer to be recrystallized disposed over the flat upper surface of said silicon dioxide substrate insulation layer, said polycrystalline or amorphous semiconductor having a flat upper surface, and
   a protecting third insulation layer different from said second insulation layer deposited on said polycrystalline or amorphous semiconductor layer to be recrystallized.

3. A wafer structure for forming a semiconductor single crystal film comprising:
   a semiconductor single crystal substrate,
   a plurality of mutually spaced grooves formed in a main surface of said semiconductor single crystal substrate,
   a first silicon dioxide layer of insulation material filling said grooves,
   a second silicon dioxide insulation layer deposited over said first layer of silicon dioxide insulation material and said semiconductor single crystal substrate surface and integral with said first layer of silicon dioxide insulation material in said grooves, said first and second silicon dioxide insulation layers forming a silicon dioxide substrate insulation layer having a flat upper surface,
   a first polycrystalline or amorphous semiconductor layer to be recrystallized disposed over the flat upper surface of said silicon dioxide substrate insulation layer, said polycrystalline or amorphous semiconductor having a flat upper surface,
   a protecting third insulation layer deposited on said polycrystalline semiconductor layer to be recrystallized, and
   a second polycrystalline or amorphous semiconductor layer to be recrystallized disposed over said third insulation layer.

4. A wafer structure for forming a semiconductor single crystal film as defined in claim 1, wherein the semiconductor single crystal substrate and the polycrystalline or amorphous semiconductor layer comprise a silicon substrate and a silicon layer, respectively.

5. A wafer structure for forming a semiconductor single crystal film as defined in claim 1, wherein an opening is formed in a portion of the second layer of silicon dioxide insulation and wherein the polycrystalline or amorphous semiconductor layer deposited over said substrate silicon dioxide insulation layer is in direct contact with said semiconductor single crystal substrate by way of said opening.

6. A wafer structure for forming a semiconductor single crystal film as defined in claim 2, wherein the semiconductor single crystal substrate and the polycrystalline or amorphous semiconductor layer comprise a silicon substrate and a silicon layer, respectively.

7. A wafer structure for forming a semiconductor single crystal film as defined in claim 3, wherein the semiconductor single crystal substrate and the polycrystalline or amorphous semiconductor layers comprise a silicon substrate and silicon layers, respectively.

8. A wafer structure for forming a semiconductor single crystal film as defined in claim 2, wherein an opening is formed in a portion of the second layer of silicon dioxide insulation and wherein the polycrystalline or amorphous semiconductor layer deposited over said silicon dioxide substrate insulation layer is in direct contact with the semiconductor single crystal substrate by way of said opening.

9. A wafer structure for forming a semiconductor single crystal film as defined in claim 3, wherein an opening is formed in a portion of the second layer of silicon dioxide insulation and wherein the second polycrystalline amorphous semiconductor layer deposited over said silicon dioxide substrate insulation layer is in direct contact with said semiconductor single crystal substrate by way of said opening.

10. A wafer structure for forming a semiconductor single crystal film as defined in claim 4, wherein an opening is formed in a portion of the second layer of silicon dioxide insulation and wherein the polycrystalline or amorphous semiconductor layer deposited over said silicon dioxide substrate insulation layer is in direct contact with said semiconductor single crystal substrate by way of said opening.

11. A method for forming a wafer structure for a semiconductor single crystal film including at least one polycrystalline or amorphous semiconductor layer to be recrystallized in heat treating to form the semiconductor single crystal film with substantially no grain boundaries, comprising the steps of:
  providing a semiconductor single crystal substrate;
  forming a plurality of mutually spaced grooves in a main surface of said semiconductor single crystal substrate;
  filling said grooves with a first layer of silicon dioxide insulation material;
  subsequently depositing a second layer of silicon dioxide insulation material over said first layer of silicon dioxide insulation material and said semiconductor single crystal substrate surface, said second layer of silicon dioxide insulation material being integral with the first layer of silicon dioxide insulation material filling said grooves, said first and second silicon dioxide insulation layers forming a silicon dioxide substrate insulation layer having a flat upper surface;
  depositing a polycrystalline or amorphous semiconductor layer over the flat upper surface of said silicon dioxide substrate insulation layer, said polycrystalline or amorphous semiconductor layer having a flat upper surface.

12. The method of claim 11 further comprising depositing a protective third insulation layer on said polycrystalline or amorphous semiconductor layer to be recrystallized.

13. The method of claim 11 further comprising providing an opening in said silicon dioxide substrate insulation layer whereby when said polycrystalline or amorphous semiconductor layer is deposited thereover said layer contacts the semiconductor single crystal substrate therethrough.

14. The method of claim 12 further comprising depositing a second polycrystalline or amorphous semiconductor layer to be recrystallized over said protective third insulation layer.

* * * * *